(12) United States Patent
Haruta et al.

(10) Patent No.: US 7,302,351 B2
(45) Date of Patent: Nov. 27, 2007

(54) POWER SUPPLY DEVICE, METHOD, PROGRAM, RECORDING MEDIUM, NETWORK ANALYZER, AND SPECTRUM ANALYZER

(75) Inventors: Masato Haruta, Saitama (JP); Yoshikazu Nakayama, Saitama (JP)

(73) Assignee: Advantest Corporation, Tokyo (JP)

( * ) Notice: Subject to any disclaimer, the term of this patent is extended or adjusted under 35 U.S.C. 154(b) by 8 days.

(21) Appl. No.: 10/536,436

(22) PCT Filed: Nov. 19, 2003

(86) PCT No.: PCT/JP03/14716

§ 371 (c)(1),
(2), (4) Date: May 26, 2005

(87) PCT Pub. No.: WO2004/049564

PCT Pub. Date: Jun. 10, 2004

(65) Prior Publication Data

US 2005/0289392 A1    Dec. 29, 2005

(30) Foreign Application Priority Data

Nov. 27, 2002   (JP)   ............................. 2002-344060

(51) Int. Cl.
*G06F 19/00* (2006.01)
*G06F 11/00* (2006.01)

(52) U.S. Cl. .......................................... 702/58; 714/14

(58) Field of Classification Search .................. 702/58, 702/57, 60, 85, 90, 117; 324/600, 601, 76.11, 324/76.22; 370/206, 208, 210; 714/4, 14; 323/293, 364, 220, 233, 318

See application file for complete search history.

(56) References Cited

U.S. PATENT DOCUMENTS 5,006,846 A * 4/1991 Granville et al. ...... 340/870.28

(Continued)

FOREIGN PATENT DOCUMENTS

JP    2-303209    12/1990

(Continued)

OTHER PUBLICATIONS

Pattison et al., Characterization and Performance of High Power Packaged Devices, 1999 IEEE, pp. 133-138.*

(Continued)

*Primary Examiner*—John Barlow
*Assistant Examiner*—Toan M. Le
(74) *Attorney, Agent, or Firm*—Greenblum & Bernstein, P.L.C.

(57) ABSTRACT

It is possible to apply a correct power to a load even when the output impedance and a load impedance of a signal source are different from a characteristic impedance of a transmission line. The power applied to the load can be expressed by a measurement system error factor, a load coefficient X of the load, and an S parameter of the input signal R. Accordingly, a target input signal decision can decide a target value of the S parameter of the input signal R according to the power desired to be applied to the load, the measurement system error factor, and the load coefficient X of the load. Furthermore, an input signal level control section controls the input signal level so that the S parameter of the input signal R has this target value. This is performed by changing the amplification ratio of an amplification ratio variable amplifier. Thus, it is possible to apply a desired power to the load not depending on whether the impedance is matched or not.

17 Claims, 8 Drawing Sheets

U.S. PATENT DOCUMENTS

| | | | |
|---|---|---|---|
| 5,047,725 A | * | 9/1991 | Strid et al. ................. 324/601 |
| 5,506,789 A | * | 4/1996 | Russell et al. ............... 702/58 |
| 6,421,624 B1 | * | 7/2002 | Nakayama et al. ......... 702/117 |
| 6,496,785 B1 | * | 12/2002 | Nakayama et al. ......... 702/117 |
| 6,552,995 B1 | | 4/2003 | Nakada ..................... 370/206 |
| 6,836,743 B1 | * | 12/2004 | Blackham et al. .......... 702/107 |

FOREIGN PATENT DOCUMENTS

| | | |
|---|---|---|
| JP | 11-038054 | 2/1999 |
| JP | 2000-13248 | 1/2000 |
| JP | 2001-272428 | 5/2001 |

OTHER PUBLICATIONS

Wei et al., Waveform Measurement Technique and Its Applications to Optimum Loading Studies on Power FETS, 2000 IEEE, pp. 666-669.*
English Language Abstract of JP 11-038054.
English Language Abstract of JP 2001-272428.
English Language Abstract of JP 2000-13248.
English Language Abstract of JP 2-303209.

* cited by examiner

POWER SUPPLY DEVICE, METHOD, PROGRAM, RECORDING MEDIUM, NETWORK ANALYZER, AND SPECTRUM ANALYZER

TECHNICAL FIELD

The present invention relates to an application of a power to a load.

BACKGROUND ART

Conventionally, an electric power has been applied by a signal source to a load in network analyzers and spectrum analyzers (refer to patent document 1 (Japanese Laid-Open Patent Publication (Kokai) No. H11-38054), for example). The signal source and the load are connected via a transmission line. On this occasion, there exist the output impedance of the signal source, the impedance of the load, and the characteristic impedance of the transmission line. If the output impedance of the signal source and the impedance of the load match the characteristic impedance of the transmission line, a correct electric power can be applied to the load.

However, the output impedance of the signal source and the impedance of the load are often different from the characteristic impedance of the transmission line. In this case, a correct electric power cannot be applied to the load. Moreover, it is difficult to manufacture a signal source whose output impedance matches the characteristic impedance of the transmission line. Consequently, a correct electric power often cannot be applied to the load.

The purpose of the present invention is to apply a correct electric power to the load upon the output impedance of the signal source and the impedance of the load being different from the characteristic impedance of the transmission line.

DISCLOSURE OF THE INVENTION

According to the present invention, a power supply device that supplies a desired electric power to a connected load, includes: an input signal measurement unit that measures a predetermined vector voltage relating to an input signal before a measurement system error factor is generated; a reflected signal measurement unit that measures a predetermined vector voltage relating to a reflected signal resulting from reflection of the input signal; a signal output acquisition unit that acquires a predetermined vector voltage relating to the input signal after the measurement system error factor is generated; a measurement system error factor acquisition unit that acquires the measurement system error factor based on the measurement results of the input signal measurement unit, the reflected signal measurement unit, and the signal output acquisition unit; a load measurement unit that measures a predetermined vector voltage relating to the load based on the measurement system error factor, and the measurement results of the input signal measurement unit and the reflected signal measurement unit upon the load being connected; a target value decision unit that decides a target value of the predetermined vector voltage relating to the input signal based on the measurement system error factor, the predetermined vector voltage relating to the load, and the desired electric power; and an input signal level control unit that controls the level of the input signal so that the predetermined vector voltage relating to the input signal takes the target value.

The electric power applied to the load is represented by the measurement system error factors, the predetermined vector voltage relating to the load, and the predetermined vector voltage relating to the input signal. Thus, the target value decision unit decides the target value of the predetermined vector voltage relating to the input signal based on the desired power to be applied to the load, the measurement system error factors, and the predetermined vector voltage relating to the load. Moreover, the input signal level control unit controls the level of the input signal so that the predetermined vector voltage relating to the input signal takes the target value. It is thus possible to apply the desired electric power to the load whether the impedances match or not.

According to the power supply device of the present invention, the reflected signal measurement unit may measure the predetermined vector voltage relating to the reflected signal resulting from reflection of the input signal from a calibration tool connected to the power supply device; and the calibration tool may realize three types of states: open, short-circuit, and standard load.

According to the power supply device of the present invention, the predetermined vector voltage may be the S parameter or the power.

A network analyzer or a spectrum analyzer may include the power supply device.

According to another aspect of the present invention, a power supply method for supplying a desired electric power to a connected load, includes: an input signal measurement step that measures a predetermined vector voltage relating to an input signal before a measurement system error factor is generated; a reflected signal measurement step that measures a predetermined vector voltage relating to a reflected signal resulting from reflection of the input signal; a signal output acquisition step that acquires a predetermined vector voltage relating to the input signal after the measurement system error factor is generated; a measurement system error factor acquisition step that acquires the measurement system error factor based on the measurement results of the input signal measurement step, the reflected signal measurement step, and the signal output acquisition step; a load measurement step that measures a predetermined vector voltage relating to the load based on the measurement system error factor, and the measurement results of the input signal measurement step and the reflected signal measurement step upon the load being connected; a target value decision step that decides a target value of the predetermined vector voltage relating to the input signal based on the measurement system error factor, the predetermined vector voltage relating to the load, and the desired electric power; and an input signal level control step that controls the level of the input signal so that the predetermined vector voltage relating to the input signal takes the target value.

Another aspect of the present invention is a program of instructions for execution by the computer to perform a power supply process of a power supply device that supplies a desired electric power to a connected load, having: an input signal measurement unit that measures a predetermined vector voltage relating to an input signal before a measurement system error factor is generated; a reflected signal measurement unit that measures a predetermined vector voltage relating to a reflected signal resulting from reflection of the input signal; and a signal output acquisition unit that acquires a predetermined vector voltage relating to the input signal after the measurement system error factor is generated; the power supply process including: a measurement system error factor acquisition step that acquires the measurement system error factor based on the measurement results of the input signal measurement step, the reflected signal measurement step, and the signal output acquisition step; a load measurement step that measures a predetermined vector voltage relating to the load based on the measurement system error factor, and the measurement results of the input signal measurement step and the reflected signal measurement step upon the load being connected; a target value decision step that decides a target value of the predetermined vector voltage relating to the input signal based on the measurement system error factor, the predetermined vector voltage relating to the load, and the desired electric power; and an input signal level control step that controls the level of the input signal so that the predetermined vector voltage relating to the input signal takes the target value.

Another aspect of the present invention is a computer-readable medium having a program of instructions for execution by the computer to perform a power supply process of a power supply device that supplies a desired electric power to a connected load, having: an input signal measurement unit that measures a predetermined vector voltage relating to an input signal before a measurement system error factor is generated; a reflected signal measurement unit that measures a predetermined vector voltage relating to a reflected signal resulting from reflection of the input signal; and a signal output acquisition unit that acquires a predetermined vector voltage relating to the input signal after the measurement system error factor is generated; including: a measurement system error factor acquisition step that acquires the measurement system error factor based on the measurement results of the input signal measurement step, the reflected signal measurement step, and the signal output acquisition step; a load measurement step that measures a predetermined vector voltage relating to the load based on the measurement system error factor, and the measurement results of the input signal measurement step and the reflected signal measurement step upon the load being connected; a target value decision step that decides a target value of the predetermined vector voltage relating to the input signal based on the measurement system error factor, the predetermined vector voltage relating to the load, and the desired electric power; and an input signal level control step that controls the level of the input signal so that the predetermined vector voltage relating to the input signal takes the target value.

BEST MODE FOR CARRYING OUT THE INVENTION

A description will now be given of an embodiment of the present invention with reference to drawings.

Figure 1:
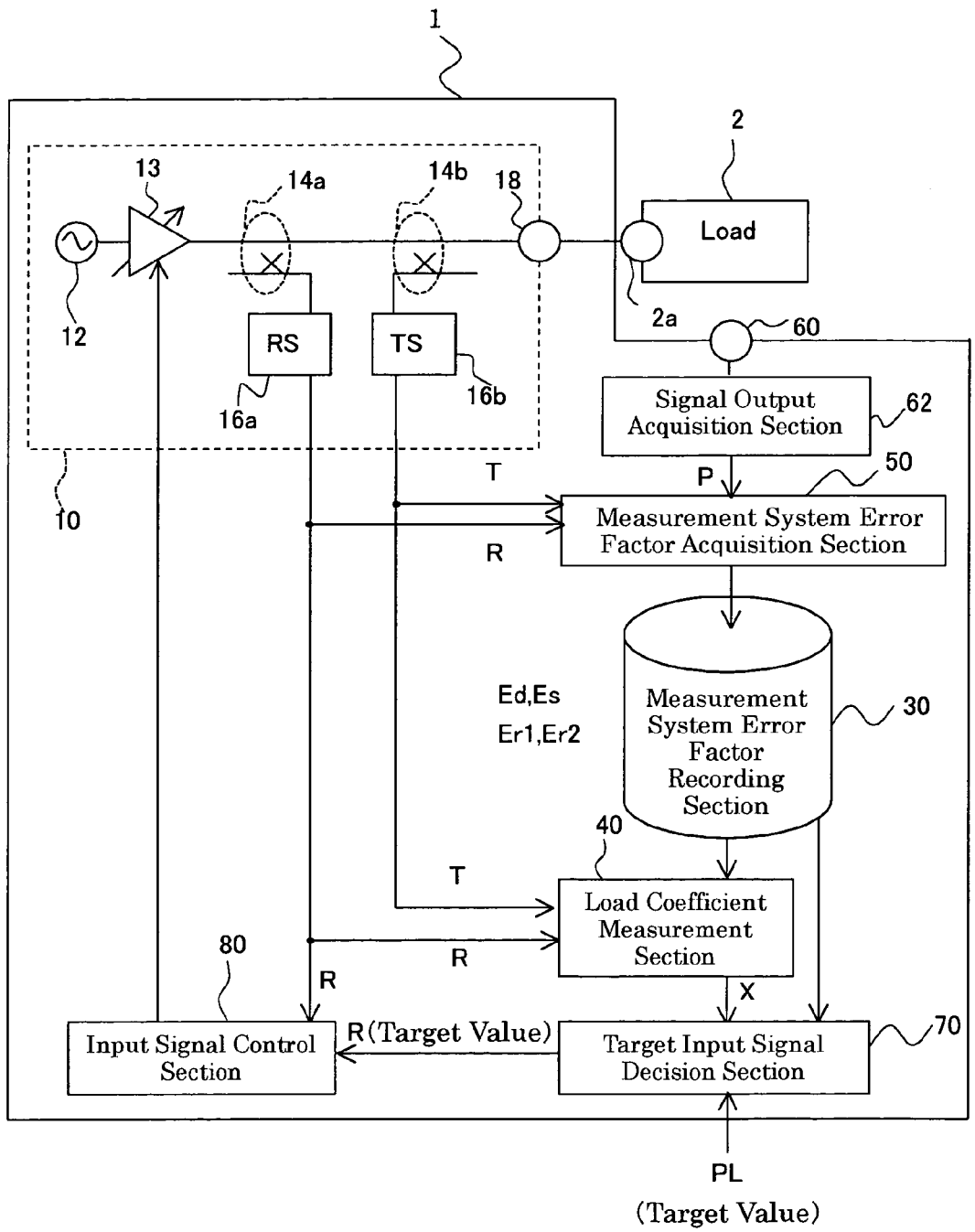
FIG. 1 is a block diagram showing the configuration of a power supply device 1 according to an embodiment of the present invention.

FIG. 1 is a block diagram showing the configuration of a power supply device 1 according to the embodiment of the present invention. A load 2 is connected to the power supply device 1. The power supply device 1 supplies the load 2 with an electric power PL. The load 2 includes an input terminal 2a.

The power supply device 1 is provided with a signal source 10, a measurement system error factor recording section 30, a load coefficient measurement section 40, a measurement system error factor acquisition section 50, a power meter terminal 60, a signal output acquisition section 62, a target input signal decision section 70, and an input signal control section 80.

The signal source 10 supplies the load 2 with a signal. The signal source 10 includes a signal output section 12, an amplification factor variable amplifier 13, bridges 14a and 14b, a receiver (RS) 16a (input signal measurement means), a receiver (TS) 16b (reflected signal measurement means), and an output terminal 18.

The signal output section 12 outputs an input signal. The input signal is a signal whose voltage is a sinusoidal wave, for example.

The amplification factor variable amplifier 13 changes the amplitude of the input signal output by the signal output section 12. It should be noted that the ratio (amplification factor) between the output amplitude and the input amplitude of the amplification factor variable amplifier 13 is variable. The amplification factor of the amplification factor variable amplifier 13 is controlled by the input signal control section 80.

The bridge 14a supplies the receiver (RS) 16a with the signal output by the signal output section 12. The signal supplied by the bridge 14a is considered as a signal which is not influenced by the measurement system error factors caused by the signal source 10. The bridge 14b supplies the receiver (TS) 16b with a reflected signal, which is the input signal output from the output terminal 18, and then is reflected back. It should be noted that the bridges 14a and 14b may be power splitters or couplers.

The receiver (RS) 16a (input signal measurement means) measures the S parameter of a signal received via the bridge 14a. The receiver (RS) 16a thus measures the S parameter relating to the input signal before influencing of the measurement system error factors caused by the signal source 10.

The receiver (TS) 16b (reflected signal measurement means) measures the S parameter of a signal received via the bridge 14b. The receiver (TS) 16b thus measures the S parameter relating to the reflected signal.

The output terminal 18 is a terminal used to output the input signal.

Figure 2:
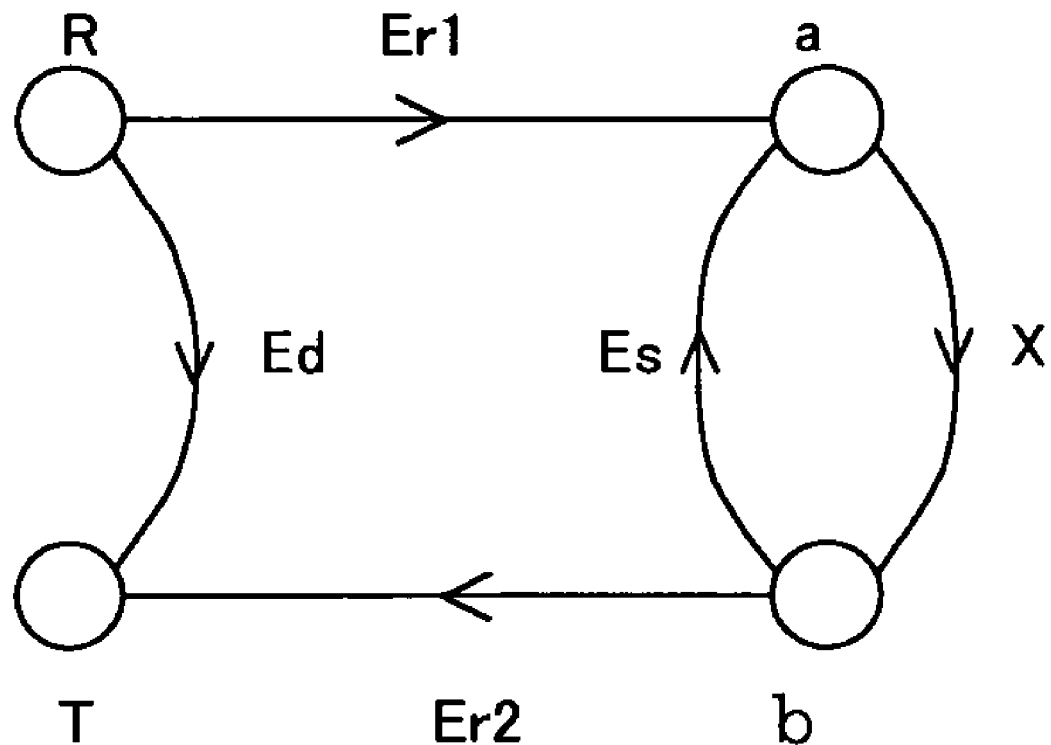
FIG. 2 is a chart as a signal flow graph representing the state shown in FIG. 1.

The measurement system error factor recording section 30 records the measurement system error factors of the power supply device 1. The measurement system error factors include Ed (error resulting from the direction of the bridge), Er1 and Er2 (errors resulting from the frequency tracking), Es (error resulting from the source matching), and Et. FIG. 2 is representation as a signal flow graph of the state shown in FIG. 1. X is a load coefficient of the load 2 and the like connected to the power supply device 1.

The load coefficient measurement section 40 measures the load coefficient X relating to the load 2 based on the measured data (S parameters) of the receiver (RS) 16a (input signal measurement means) and the receiver (TS) 16b (reflected signal measurement means) upon the load 2 being connected to the power supply device 1, and the measurement system error factors recorded by the measurement system error factor recording section 30. It should be noted that the measured data by the receiver (RS) 16a (input signal measurement means) is denoted as R, and the measured data by the receiver (TS) 16b (reflected signal measurement means) is denoted as T.

The load coefficient measurement section 40 measures the load coefficient X of the load 2 according to the following equation.

$$X = \frac{1}{Es + \frac{Er1\ Er2}{\frac{T}{R} - Ed}} \quad \text{[Equation 1]}$$

The measurement system error factor acquisition section 50 acquires the measurement system error factors (Ed, Er1, Er2, Es) based on the measurement results of the receiver (RS) 16a (input signal measurement means), the receiver (TS) 16b (reflected signal measurement means), and the signal output acquisition section 62. Upon the acquisition of the measurement system error factors, the calibration tool 4 and the power meter 6 are sequentially connected to the signal source 10.

Figure 3:
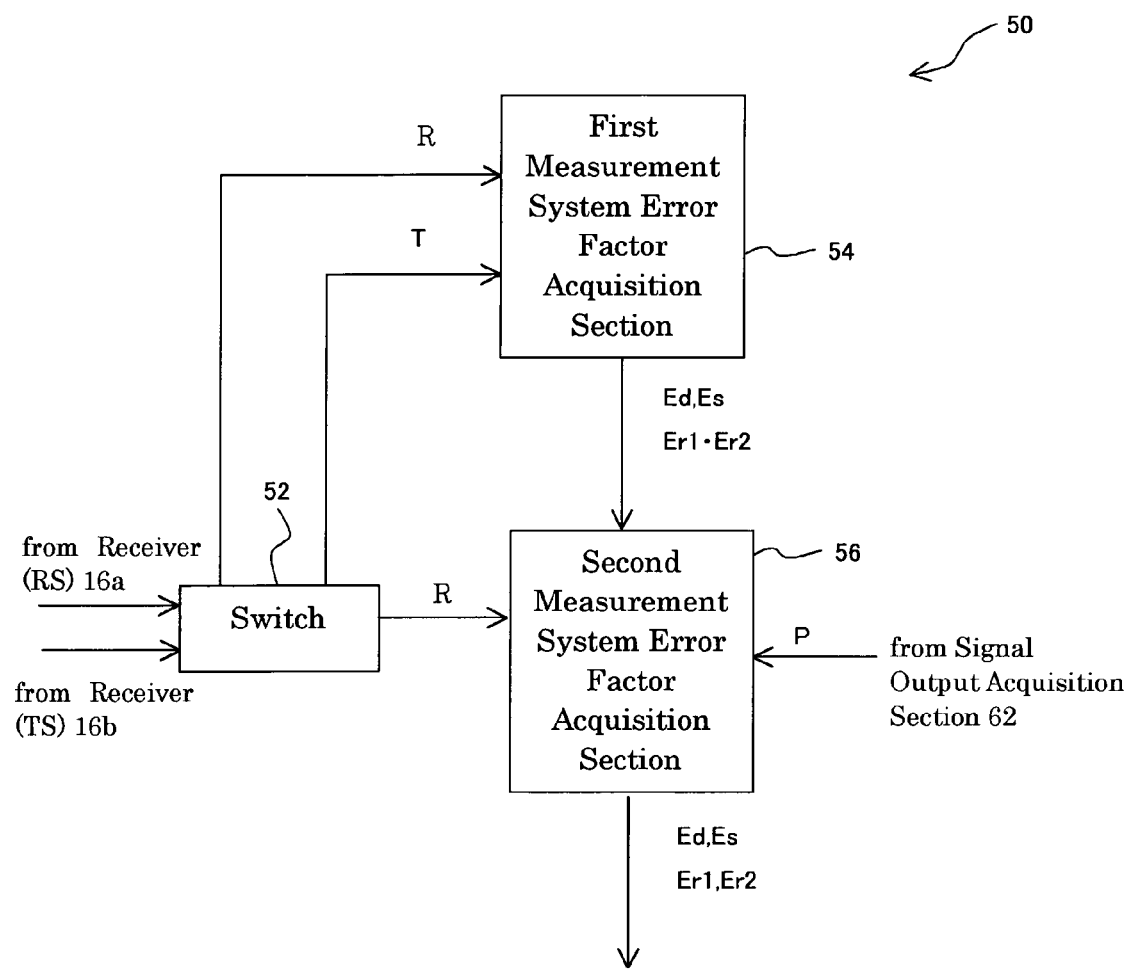
FIG. 3 is a block diagram showing the configuration of a measurement system error factor acquisition section 50.

FIG. 3 shows the configuration of the measurement system error factor acquisition section 50. The measurement system error factor acquisition section 50 includes a switch 52, a first measurement system error factor acquisition section 54, and a second measurement system error factor acquisition section 56.

The switch 52 receives measured data (such as the S parameters) from the receiver (RS) 16a (input signal measurement means) and the receiver (TS) 16b (reflected signal measurement means), and outputs these signals to either the first measurement system error factor acquisition section 54 or the second measurement system error factor acquisition section 56 according to the type of what is connected to the signal source 10.

Namely, the switch 52 outputs the measured data (such as the S parameters) received from the receiver (RS) 16a and the receiver (TS) 16b to the first measurement system error factor acquisition section 54 if the calibration tool 4 is connected to the signal source 10, or to the second measurement system error factor acquisition section 56 if the power meter 6 is connected to the signal source 10.

Figure 4:
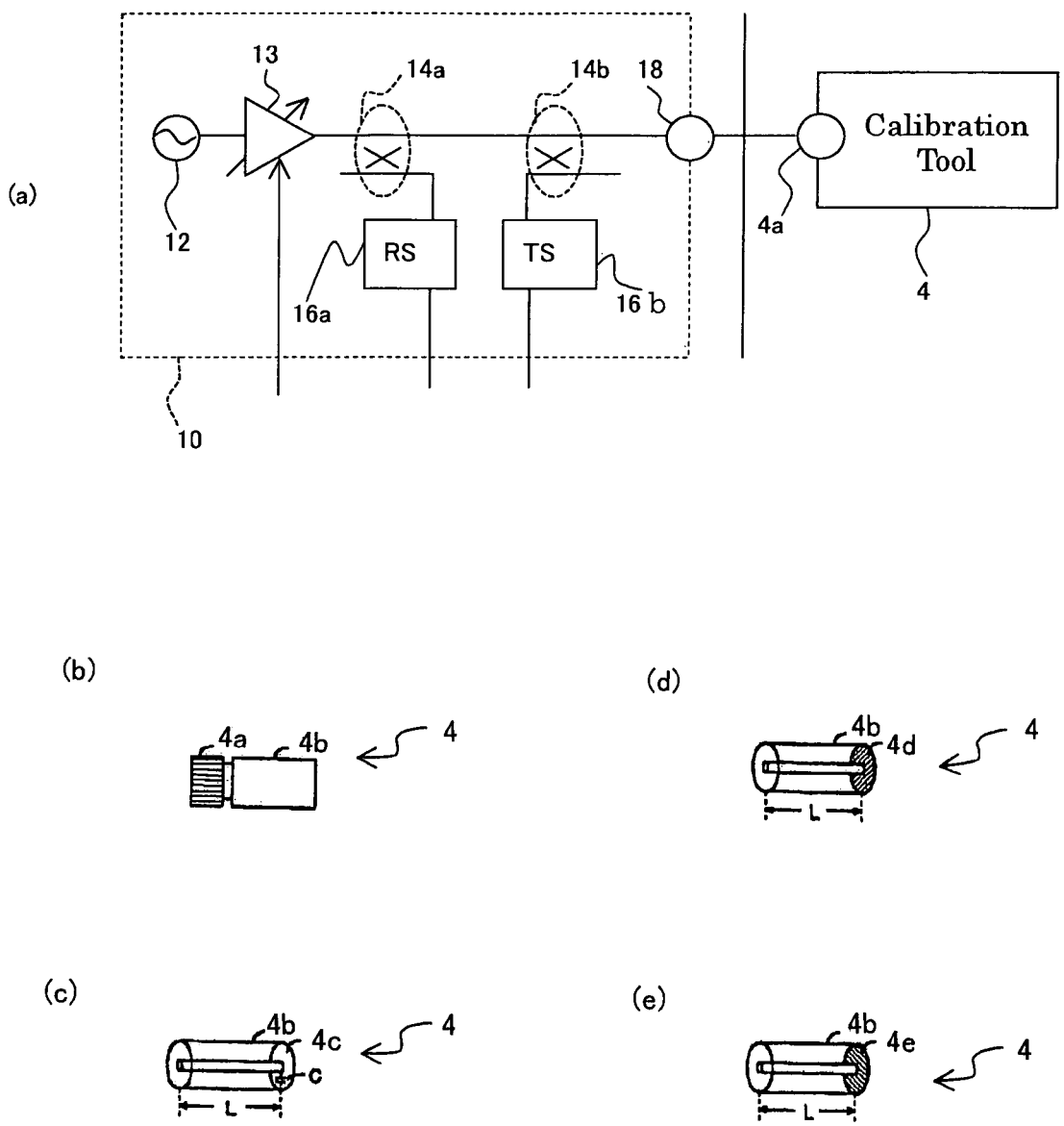
FIG. 4 is a block diagram showing the state where a calibration tool 4 is connected to a signal source 10 (FIG. 4(a)) and the exteriors of the calibration tool 4 (FIGS. 4(b) to (e))

The first measurement system error factor acquisition section 54 receives the measured data of the receiver (RS) 16a and the receiver (TS) 16b upon the calibration tool 4 being connected to the signal source 10, and acquires Ed, Es, and Er1·Er2 (the product of Er1 and Er2). FIG. 4(a) shows the state where the calibration tool 4 is connected to the signal source 10. A terminal 4a of the calibration tool 4 is connected to the output terminal 18 of the signal source 10. It should be noted that parts other than the signal source 10 of the network analyzer 1 are omitted the in FIG. 4(a). The calibration tool 4 is a widely known one which realizes three states: open, short-circuit, and load (standard load Z0) as described in the Japanese Laid-Open Patent Publication (Kokai) No. H11-38054.

The exterior of the calibration tool 4 is shown in FIG. 4(b), and the calibration tool 4 includes a connector 4a and a main unit 4b. FIG. 4(c) shows an open element, and although a terminal 4c is open, a stray capacitance C exists. FIG. 4(d) shows a short-circuit element, and a terminal 4d is short-circuited. FIG. 4(e) is a load element, and a terminal 4e is terminated by the standard load (impedance) Z0.

FIG. 2 shows the state represented as a signal flow graph where the calibration tool 4 is connected to the signal source 10. The measured data of the receiver (RS) 16a is denoted as R, and the measured data of the receiver (TS) 16b is denoted as T. X represents the load coefficient of the calibration tool 4. The relationship between R and T is represented by the following equation.

$$\frac{T}{R} = Ed + \frac{Er1Er2 \cdot X}{1 - EsX} \quad \text{[Equation 2]}$$

Since the three types of the calibration tool 4 are connected, three types of combination of R and T are obtained. Accordingly, obtained variables are the three types of the variables: Ed, Es, and Er1·Er2.

The second measurement system error factor acquisition section 56 acquires the measured data of the receiver (RS) 16a: Ed, Es, and Er1·Er2 (measurement system error factors acquired by the first measurement system error factor acquisition section 54), and receives the output (power P) of the signal output acquisition section 62, and acquires Er1 and Er2 upon the power meter 6 being connected to the signal source 10 and the power meter terminal 60.

Figure 5:
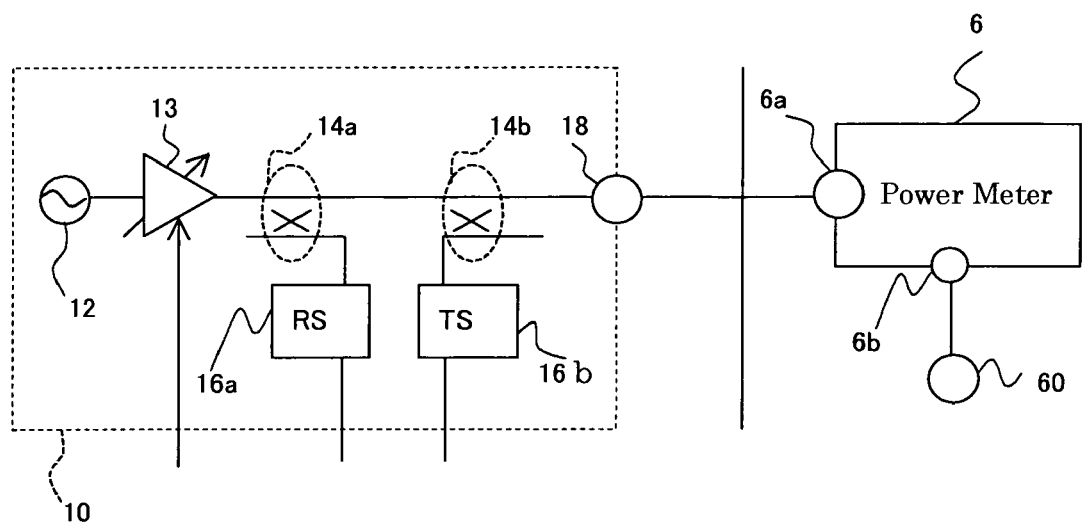
FIG. 5 is a chart as a signal flow graph representing the state where the calibration tool 4 is connected to the signal source 10.

FIG. 5 shows the state where the power meter 6 is connected to the signal source 10 and the power meter terminal 60. It should be noted that parts other than the signal source 10 of the network analyzer 1 and the power meter terminal 60 are omitted in FIG. 6. A terminal 6a of the power meter 6 is connected to the output terminal 18 of the signal source 10. The terminal 6b of the power meter 6 is connected to the power mater terminal 60. The power meter 6 measures the power of the signal received via the terminal 6a. The signal output acquisition section 62 acquires the power P via the power meter terminal 60 and the terminal 6b, and outputs the power P to the second measurement system error factor acquisition section 56.

Figure 6:
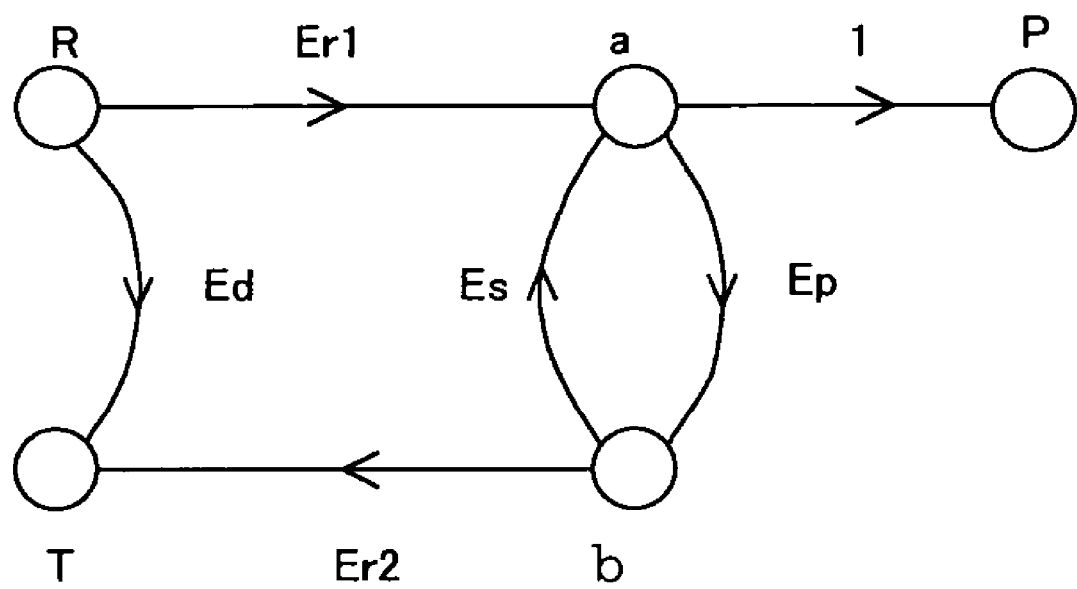
FIG. 6 is a signal flow graph representing the state shown in FIG.5.

FIG. 6 shows the state as a signal flow graph where the power meter 6 is connected to the signal source 10 and the power meter terminal 60. The measured data of the receiver (RS) 16a is denoted as R, and the measured data of the power meter 6 is denoted as P. As is clearly shown in FIG. 6, P is a vector voltage relating to the input signal, and is acquired after the measurement system error factors are generated. The relationship between R and P is represented by the following equation.

$$\frac{P}{R} = \frac{Er1}{1 - EsEp} \quad \text{[Equation 3]}$$

In this equation, Es is known, Ep can be measured, and Er1 is thus obtained. Since Er1·Er2 is known, Er2 can also be obtained. In this way, it is possible to obtain Er1 and Er2, which are mutually opposite in direction in the signal flow graph (refer to FIG. 6), from Er1·Er2. Namely, it is possible to separate Er1 and Er2, which are combined as Er1·Er2.

The first measurement system error factor acquisition section 54 receives the measured data of the receiver (RS) 16a (input signal measurement means) and the receiver (TS) 16b (reflected signal measurement means) to acquire Ed, Es, Er1·Er2. The second measurement system error factor acquisition section 56 receives the measured data of the receiver (RS) 16a (input signal measurement means) and the signal output acquisition section 62 to acquire Er1 and Er2. Thus, the first measurement system error factor acquisition section 54 and the second measurement system error factor acquisition section 56 acquires the measurement system error factors (Ed, Es, Er1, Er2) based on the measured data of the receiver (RS) 16a (input signal measurement means), the receiver (TS) 16b (reflected signal measurement means), and the signal output acquisition section 62.

The power meter terminal 60 is connected to the terminal 6b of the power meter 6. The signal output acquisition section 62 acquires the power P via the power meter terminal 60 and the terminal 6b, and outputs the power P to the second measurement system error factor acquisition section 56. The power P is a signal acquired after the influence of the measurement system error factors caused by the signal source 10 are generated.

The target input signal decision section 70 decides a target value of the S parameter of the input signal R based on the measurement system error factors (Ed, Es, Er1, Er2), the load coefficient X of the load 2, and the desired electric power PL applied to the load 2.

The electric power PL applied to the load 2 is represented as the following equation.

$$PL = |a|^2 = \left| \frac{Er1}{1 - EsX} \right| |R|^2 \quad \text{[Equation 4]}$$

The S parameter of the input signal R is thus represented as the following equation.

$$|R| = \frac{\sqrt{PL}}{\left| \frac{Er1}{1 - EsX} \right|} \quad \text{[Equation 5]}$$

It is thus possible to obtain the target value of the S parameter of the input signal R by assigning the target value of the electric power PL, Er1, Es, and X to the above equation. The electric power PL achieves the target value if the S parameter of the input signal R is caused to take this target value.

The input signal control section 80 controls the level of the input signal so that the S parameter of the input signal R takes the target value obtained by the target input signal decision section 70. The input signal control section 80 controls the level of the input signal by changing the amplification factor of the amplification factor variable amplifier 13.

Figure 7:
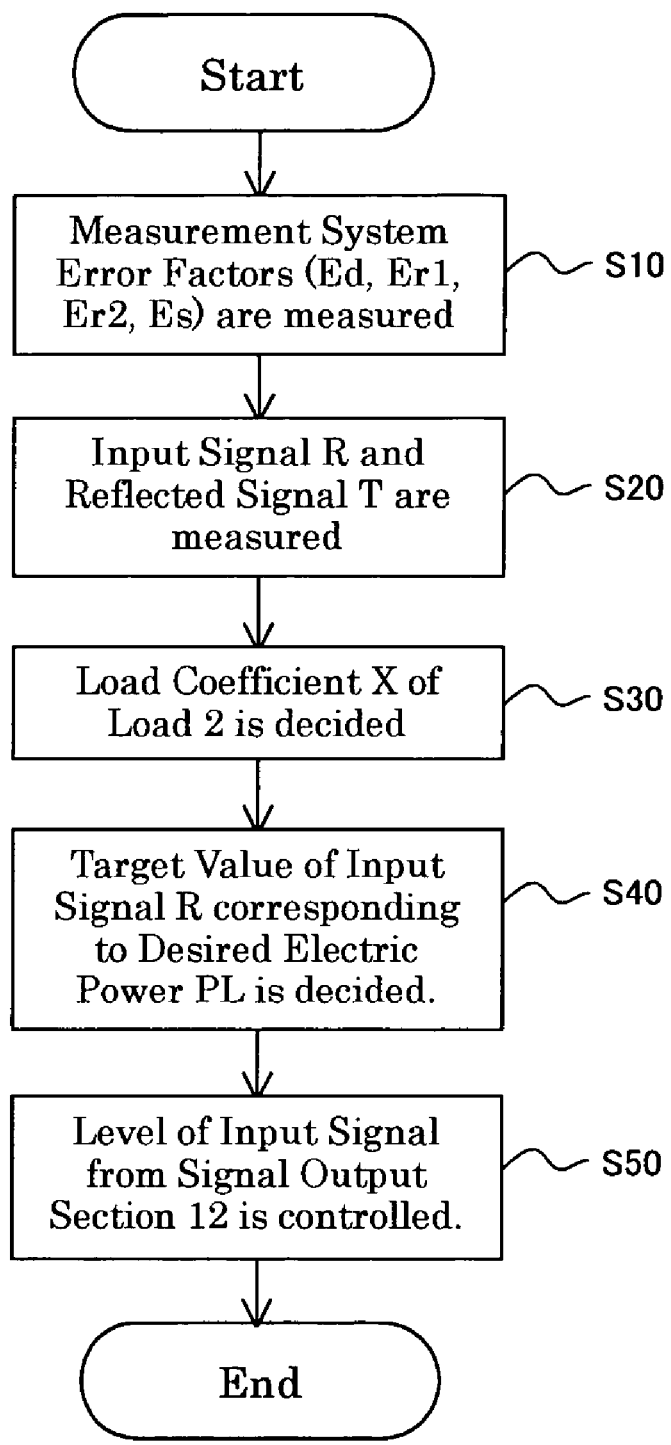
FIG. 7 is a flowchart showing the operation of the embodiment of th present invention.

A description will now be given of the operation of the embodiment of the present invention. FIG. 7 is a flowchart showing the operation of the embodiment of the present invention.

Figure 8:
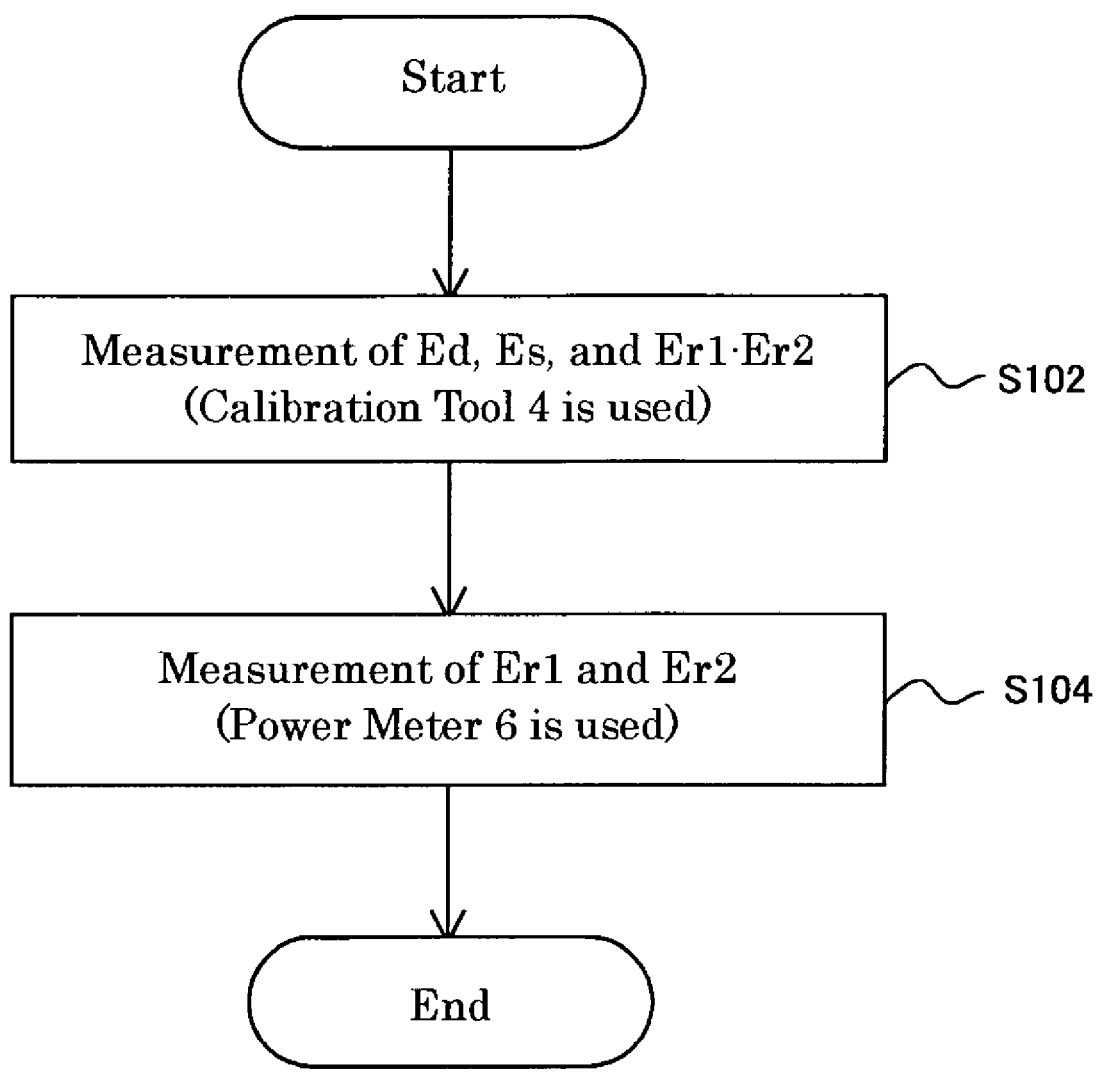
FIG. 8 is a flowchart showing the operation upon measurement system error factors being measured.

The power supply device 1 first measures the measurement system error factors (Ed, Es, Er1, Er2) (S10). The measured measurement system error factors are recorded in the measurement system error factor recording section 30. A description will now be given of the operation upon the measurement system error factors being measured with reference to a flowchart in FIG. 8.

The three types of the calibration tool 4 are first connected to the signal source 10. The signal output section 12 outputs the input signal. On this occasion, the receiver (RS) 16a measures the input signal. The input signal is input to the calibration tool 4 via the output terminal 18. The receiver (TS) 16b then measures the reflected signal reflected by the calibration tool 4. The first measurement system error factor acquisition section 54 receives the measured data of the receiver (RS) 16a and the receiver (TS) 16b to acquire Ed, ES, and Er1·Er2 (the product of Er1 and Er2) (S102).

The power meter 6 is then connected to the signal source 10 and the power meter terminal 60. The signal output section 12 outputs the input signal. On this occasion, the receiver (RS) 16a measures the input signal. The input signal is input to the power meter 6 via the output terminal 18 and the terminal 6a. The power meter 6 measures the power P of the input signal. The signal output acquisition section 62 then acquires the power P via the power meter terminal 60 and the terminal 6b, and outputs the power P to the second measurement system error factor acquisition section 56. The second measurement system error factor acquisition section 56 receives the measured data Ed, Es, and Er1·Er2 of the receiver (RS) 16a (measurement system error factors acquired by the first measurement system error factor acquisition section 54), and the output (power P) of the signal output acquisition section 62 to acquire Er1 and Er2 (S104).

Returning to FIG. 7, the load 2 is connected to the power supply device 1 (refer to FIG. 1), and the S parameter of the input signal R and the S parameter of the reflected signal T are actually measured (S20). Namely, the signal output section 12 outputs the input signal. On this occasion, the receiver (RS) 16a measures the input signal. The data obtained by this measurement is R. The input signal is input to the DUT 2 via the output terminal 18. The receiver (TS) 16b then measures the reflected signal reflected by the DUT 2. The data obtained by this measurement is T.

The load coefficient measurement section 40 then decides the load coefficient X of the load 2 (S30). Namely, the load coefficient measurement section 40 measures the load coefficient X of the load 2 based on the measured data (S parameters) of the receiver (RS) 16a (input signal measurement means) and the receiver (TS) 16b (reflected signal measurement means) upon the load 2 being connected to the power supply device 1, and the measurement system error factors recorded by the measurement system error factor recording section 30.

The target input signal decision section 70 then decides the target value of the S parameter of the input signal R based on the measurement system error factors (Ed, Es, Er1, Er2), the load coefficient X of the load 2, and the target value of the electric power PL applied to the load 2 (S40).

The input signal control section 80 controls the level of the input signal so that the S parameter of the input signal R takes the target value obtained by the target input signal decision section 70 (S50).

With the embodiment according to the present invention, the electric power PL applied to the load can be represented by the measurement system error factors (Er1, Es), the load coefficient X of the load 2, and the S parameter of the input signal R (refer to Equation 4). The target input signal decision section 70 thus can decide the target value of the S parameter of the input signal R based on the desired electric power to be applied to the load 2, the measurement system error factors (Er1, Es), and the load coefficient X of the load 2 (refer to Equation 5). The input signal level control section 80 controls the level of the input signal so that the S parameter of the input signal R takes the target value. This is carried out by changing the amplification factor of the amplification factor variable amplifier 13. It is thus possible to apply the desired power to the load whether the impedances match or not.

In the above-mentioned embodiment, a computer provided with a CPU, a hard disk, and a media (floppy disk, CD-ROM, and the like) reading device is caused to read a medium recording a program which realizes the above-mentioned respective elements, and to install the program on the hard disk. The power supply device 1 can also be realized in this way.

The invention claimed is:

1. A power supply device that supplies a desired electric power to a connected load connected to an output terminal, comprising:
   an input signal measurer that measures a predetermined vector voltage relating related to an input signal before a measurement system error factor is generated;
   a reflected signal measurer that measures a predetermined vector voltage related to a reflected signal resulting from reflection of the input signal;
   a signal output acquisitioner that acquires a predetermined vector voltage related to the input signal from a power meter directly connected to the output terminal, after the measurement system error factor is generated;
   a measurement system error factor acquisitioner that acquires the measurement system error factor based on measurement results of said input signal measurer, said reflected signal measurer, and said signal output acquisitioner;
   a load measurer that measures a predetermined vector voltage related to the load based on the measurement system error factor, and the measurement results of said input signal measurer and said reflected signal measurer upon the load being connected;
   a target value decider that decides a target value of the predetermined vector voltage related to the input signal based on the measurement system error factor, the predetermined vector voltage related to the load, and the desired electric power; and
   an input signal level controller that controls a level of the input signal so that the predetermined vector voltage related to the input signal takes the target value.

2. The power supply device according to claim 1, wherein said reflected signal measurer measures the predetermined vector voltage related to the reflected signal resulting from reflection of the input signal from a calibration tool connected to the power supply device; and
   wherein said calibration tool realizes three types of states: open, short-circuit, and standard load.

3. The power supply device according to claim 2, wherein the predetermined vector voltage comprises one of an S parameter and power.

4. A network analyzer comprising the power supply device according to claim 3.

5. A spectrum analyzer comprising the power supply device according to claim 3.

6. A network analyzer comprising the power supply device according to claim 2.

7. A spectrum analyzer comprising the power supply device according to claim 2.

8. The power supply device according to claim 1, wherein the predetermined vector voltage comprises one of an S parameter and power.

9. A network analyzer comprising the power supply device according to claim 8.

10. A spectrum analyzer comprising the power supply device according to claim 8.

11. A network analyzer comprising the power supply device according to claim 1.

12. A spectrum analyzer comprising the power supply device according to claim 1.

13. The power supply device of claim 1, further comprising an amplification factor variable amplifier that changes the amplitude of the input signal,
   wherein an amplification factor of the amplification factor variable amplifier is variably controlled by the input signal level controller.

14. A power supply method for supplying a desired electric power to a connected load connected to an output terminal, comprising:
   measuring a predetermined vector voltage related to an input signal before a measurement system error factor is generated;
   measuring a predetermined vector voltage related to a reflected signal resulting from reflection of the input signal;
   acquiring a predetermined vector voltage related to the input signal from a power meter directly connected to the output terminal, after the measurement system error factor is generated;
   acquiring the measurement system error factor based on the measuring of the predetermined vector voltage related to the input signal before the measurement system error factor is generated, the measuring of the predetermined vector voltage related to the reflected signal resulting from reflection of the input signal, and the acquiring of the predetermined vector voltage related to the input signal after the measurement system error factor is generated;
   measuring a predetermined vector voltage related to the load based on the measurement system error factor, and the measurement results of the predetermined vector voltage related to the input signal before the measurement system error factor is generated and the predetermined vector voltage related to the reflected signal resulting from reflection of the input signal upon the load being connected;
   deciding a target value of the predetermined vector voltage relating to the input signal based on the measurement system error factor, the predetermined vector voltage relating to the load, and the desired electric power; and
   controlling a level of the input signal so that the predetermined vector voltage relating to the input signal takes the target value.

15. The power supply method of claim 14, further comprising:
   changing the amplitude of the input signal, and
   controlling a variable amplification factor between an output amplitude and an input amplitude.

16. A computer-readable medium having a program of instructions for execution by a computer to perform a power supply process of a power supply device that supplies a desired electric power to a connected load connected to an output terminal, having an input signal measurer that measures a predetermined vector voltage related to an input signal before a measurement system error factor is generated; a reflected signal measurer that measures a predetermined vector voltage related to a reflected signal resulting from reflection of the input signal; and a signal output acquisitioner that acquires a predetermined vector voltage related to the input signal from a power meter directly connected to the output terminal, after the measurement system error factor is generated;

said power supply process comprising:

acquiring the measurement system error factor based on measurement results of the input signal measurer, the reflected signal measurer, and the signal output acquisitioner;

measuring a predetermined vector voltage related to the load based on the measurement system error factor, and measurement results of the input signal measurer and the reflected signal measurer upon the load being connected;

deciding a target value of the predetermined vector voltage related to the input signal based on the measurement system error factor, the predetermined vector voltage relating to the load, and the desired electric power; and controlling a level of the input signal so that the predetermined vector voltage relating to the input signal takes the target value.

17. The computer-readable medium of claim 16, wherein the power supply process further comprises:

changing the amplitude of the input signal, and controlling a variable amplification factor between an output amplitude and an input amplitude.

* * * * *